United States Patent [19]

Tsividis

[11] Patent Number: 5,293,058
[45] Date of Patent: Mar. 8, 1994

[54] LINEAR VOLTAGE-CONTROLLED RESISTANCE ELEMENT
[75] Inventor: Yannis Tsividis, Agia Paraskevi, Greece
[73] Assignee: The Trustees of Columbia University, New York, N.Y.
[21] Appl. No.: 975,599
[22] Filed: Nov. 12, 1992
[51] Int. Cl.⁵ ............................................. H01L 29/78
[52] U.S. Cl. .................................. 257/364; 257/379; 338/225 D
[58] Field of Search ............... 257/364, 365, 363, 154, 257/358, 359, 379, 380, 154; 330/277; 307/303.2, 304, 568; 338/225 D; 323/217

[56] References Cited

U.S. PATENT DOCUMENTS

| | | | |
|---|---|---|---|
| 3,441,748 | 4/1969 | Werner | 307/568 |
| 3,577,019 | 5/1971 | Storm | 307/304 |
| 3,829,882 | 8/1974 | Arai | 257/266 |
| 3,943,286 | 3/1976 | Tsurushima | 330/277 |
| 3,968,452 | 7/1976 | Sahara et al. | 257/364 |
| 4,710,726 | 12/1987 | Czarnul | 330/69 |
| 5,010,385 | 4/1991 | Shoemaker | 307/303.2 |

OTHER PUBLICATIONS

A. Bilotti, "Operation of a MOS Transistor as a Variable Resistor," IEEE Proceedings, vol. 54, pp. 1093-1094, Aug. 1966.
M. Banu et al., "Floating Voltage-Controlled Resistors in CMOS Technology," Electron. Letters, vol. 18, pp. 678-679, Jul. 22, 1982.
K. Nagaraj, "New CMOS Floating Voltage-Controlled Resistor," Electron. Letters, vol. 22, pp. 667-668, Jun. 5, 1986.
P. M. Vanpeteghem et al., "New CMOS Resistor Implementation for Linear IC Applications," Electron. Letters, vol. 24, No. 5, pp. 288-290, Mar. 3, 1988.
S. P. Singh, et al, "A New Floating Resistor for CMOS Technology," IEEE Trans. CAS, vol. CAS-36, pp. 1217-1220, 1989.
G. Wilson et al., "Novel Voltage-Controlled Grounded Resistor," Electronics Letters, vol. 25, No. 25, pp. 1725-1726, Dec. 7, 1989.
J. Silva-Martinez et al., "Very Linear CMOS Floating Resistor," El. Letters, vol. 26, pp. 1610-1611, Sep. 13, 1990.
Z. Wang, "Novel Electronically-Controlled Floating Resistors Using MOS Transistors Operating in Saturation," El. Letters, vol. 27, pp. 188-189, Jan. 1991.
M. Steyaert et al., "A High-Frequency Saturated CMOS Floating Resistor for . . . Signal Processors," Electronics Letters, pp. 1609-1610, Aug. 29, 1991.
M. Banu et al., "Fully Integrated Active RC Filters," IEEE ISCAS '83, pp. 602-605, 1983.
W. R. Patterson et al., "Harmonic Suppression in . . . Mosfet Circuit Topologies Using Body Signals," El. Letters, vol. 25, pp. 1737-1739, Dec. 7, 1989.
G. Toumazou et al., "Linear Tunable Resistance Circuit Using Gallium Arsenide MESFETs," Electronics Letters. vol. 27, No. 8, pp. 655-657, Apr. 11, 1991.
R. W. Coen et al, "Velocity of Surface Carriers in Inversion Layers on Silicon," Solid State Electronics, vol. 23, pp. 35-40, 1980.
Z. Czarnul, "Novel MOS Resistive Circuit for Synthesis of . . . Continuous Time-Time Filters," IEEE, vol. CAS-33, No. 7, pp. 718-721, Jul. 1986.
Z. Czarnul, "Modification of Banu-Tsividis Continuous-Time Integrator Structure," IEEE, vol. CAS-33, No. 7, pp. 714-716, Jul. 1986.
Y. Tsividis et al., "Continuous-Time Mosfet-C Filters in VLSI," IEEE Transactions, Circuits-Systems, vol. CAS-33, No. 2, pp. 125-140, Feb. 1986.

Primary Examiner—Sara W. Crane
Attorney, Agent, or Firm—Brumbaugh, Graves, Donohue & Raymond

[57] ABSTRACT

The channel resistance of a MOSFET is made independent of $V_S - V_D$ by maintaining the ends of the gate electrode adjacent the source and drain regions at an offset voltage with respect to the source and drain regions, respectively, and by maintaining the portions of the body region adjacent to the source and drain regions at another offset voltage with respect to the source and drain regions, respectively. In this manner, $V_S - V_D$ appears across the channel, across the gate, and across the body region beneath the channel. The resulting linear voltage drops along each of the three causes the channel-to-gate and channel-to-body potentials to be constant along the entire length of the channel, thereby avoiding variations in the number of carriers, mobility variations and body effect in the channel.

9 Claims, 4 Drawing Sheets

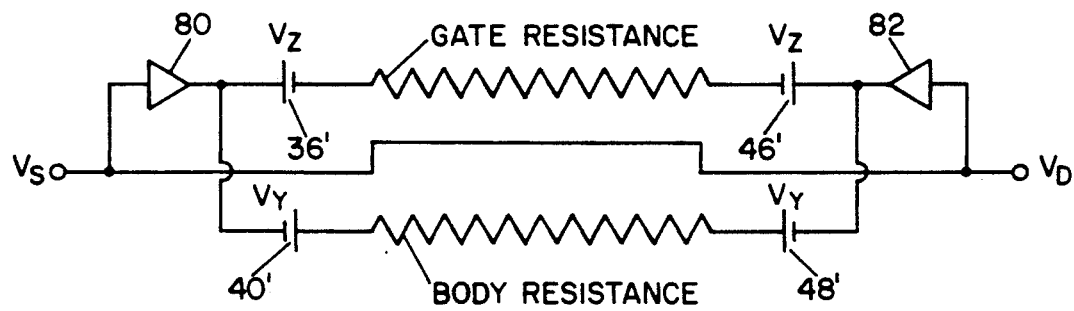
FIG. 6
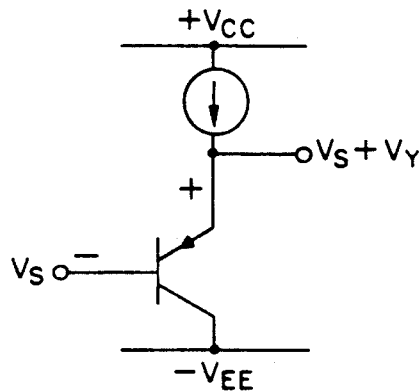
FIG. 7A
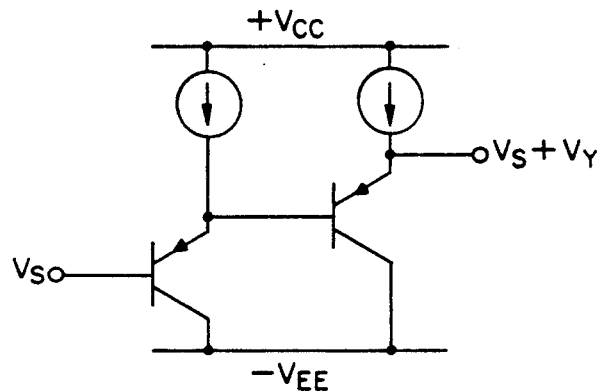
FIG. 7B
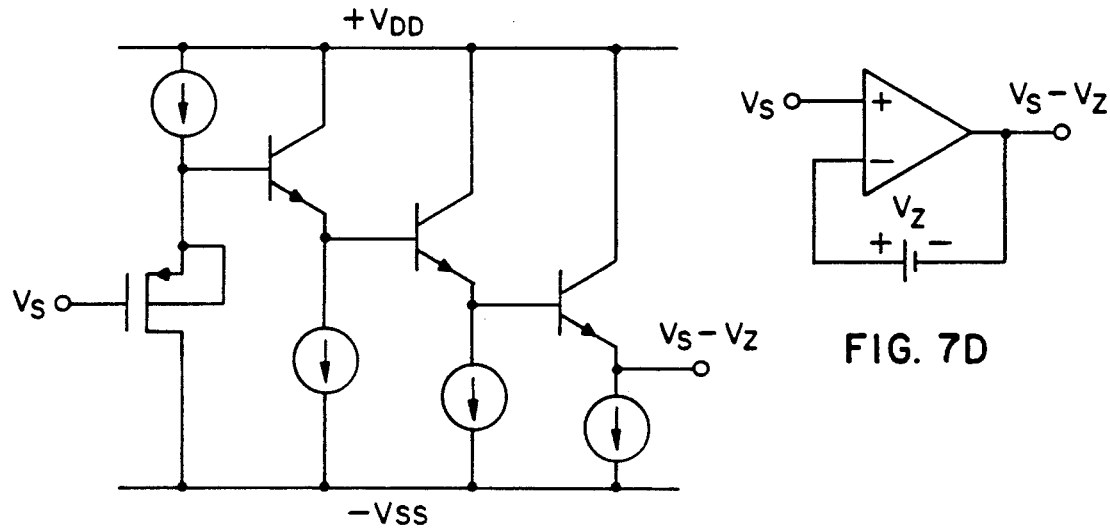
FIG. 7C
FIG. 7D

LINEAR VOLTAGE-CONTROLLED RESISTANCE ELEMENT

BACKGROUND OF THE INVENTION

This invention generally relates to semiconductor devices, and more particularly to an arrangement for linearizing the channel resistance of a field-effect transistor and thereby improving its utility as a voltage-controlled resistance element.

Certain properties of the field-effect transistor, especially the well known metal-oxide-semiconductor field-effect transistor (MOSFET), make it desirable for use in solid-state circuits as a voltage controlled resistance element. The MOSFET is a voltage-controlled device, in which the resistance between source and drain electrodes may be controlled by the voltage applied to the gate electrode. Typically, the device comprises two relatively highly-doped, spaced-apart regions of one conductivity type formed in the surface of a semiconductor body region of the opposite conductivity type; these two spaced-apart regions are referred to as the source and drain, respectively. A thin layer of insulating material, usually a thermally grown native oxide layer, is formed over the surface of the semiconductor body region between the source and the drain regions to provide the gate dielectric, and a layer of conductive material, such as metal or polycrystalline semiconductor, is formed on the gate dielectric between the source and drain regions to serve as the gate electrode. Individual electrical contacts are made to the source and drain regions to provide source and drain electrodes.

With the body region tied to a reference potential, such as ground, a voltage applied to the gate electrode controls the number of charge carriers in a channel created at the surface of the body region between the source and the drain regions. For example, in a P-channel MOSFET formed in an N-type silicon substrate and having P-type source and drain regions, a negative voltage bias applied to the gate electrode modifies conditions within the surface of the silicon substrate. As the magnitude of this negative voltage bias increases, the silicon surface beneath the gate electrode first undergoes depletion, followed by weak inversion, and then by increasingly strong inversion. When inversion occurs in the silicon surface beneath the gate electrode, a P-type inversion layer, or channel, extends between the P-type source and drain regions of the MOSFET. Thus, an appropriate voltage signal on the gate electrode can modulate the number of carriers within the channel electrode so that for a given voltage across the source and drain electrodes, the gate electrode controls current flowing in the channel. For constant gate voltage, an increase in the voltage across the source and drain electrodes causes an increase in the channel current, which in turn produces an increase in the resistive voltage (IR) drop along the channel. This voltage drop produces an electric field opposing the electric field in the silicon surface produced by the gate bias. When this voltage drop at any point along the channel reaches a value sufficient to reduce the net electric field in the silicon surface to be near the threshold required to cause inversion, "pinch off" of the channel occurs, and the drain current enters "saturation" at a relatively constant value, largely independent of the voltage across the source and drain electrodes of the MOSFET device.

It is the controllability of the channel resistance, which may have a value ranging from megohms to hundreds or tens of ohms depending on its dimensions, applied voltages, and the materials and process used for fabricating the device, that allows the MOSFET device to be employed as a voltage-controlled circuit resistance element. These and other properties of the MOSFET suggest it for numerous applications, such as a solid-state voltage-controlled resistor in equipment, such as variable RC time-constant circuits and voltage-controlled attenuators. However, because the channel resistance, defined as the ratio of the voltage across the channel to the current flowing through the channel, varies with the voltage across the source and drain electrodes, it cannot be used in many applications that require a resistance element which is independent of the direction (or polarity) and magnitude of the voltage across, and current through the element. In short, the value of the controllable resistance of the element should be independent of the voltage applied across the two terminals of the element.

Techniques have been proposed for linearizing the channel resistance of an insulated-gate field-effect transistor. Typically, these are circuit techniques which utilize the transistor in its triode (nonsaturation) region of operation. Several of these techniques are described in an article entitled "Continuous-Time MOSFET-C Filters in VSLI" by Y. Tsividis, M. Banu and J. Khoury, IEEE Transactions, Circuits-Systems, Vol. CAS-33, No. 2, pp. 125-140, Feb. 1986. The circuits described in this article include devices that operate in the manner shown in FIG. 1A or FIG. 1B, which schematically illustrate a MOSFET in its triode (nonsaturation) region of operation having its gate connected to a control voltage $V_c$. The control voltage $V_c$ may be provided by an automatic tuning system (not shown). The body of the MOSFET is connected to a fixed DC bias $V_B$. The source and drain voltages, $V_S$ and $V_D$, are assumed to remain sufficiently low to allow operation in the nonsaturation region. The channel current of the transistor, I, can be written in the form $I = i_L - i_N$, where $i_N$ is a nonlinear term in $V_S$ and $V_D$, and $i_L$ is a linear term given by $i_L = G(V_D - V_S)$ with G being the channel conductance. The nonlinearities in the current, I, versus $V_S - V_D$ are mainly second-order, and are cancelled in various ways, for example, by making $V_D = -V_S$ in the arrangement of FIG. 1A, by making $V_C$ an appropriate function of $V_S$ and $V_D$, or by using pairs of devices connected as in FIG. 1A or 1B and taking the difference of the currents through the two devices while driving the devices in a balanced fashion.

All of the proposed methods described in the aforementioned article suffer from the following limitations:

(a) If the two devices used in a pair are not perfectly matched, the cancellation of the second-order nonlinearities will not be perfect; the same problem occurs if the driving signals used are not perfectly balanced.

(b) The odd-order terms do not cancel out owing to mobility variations caused by variations in the gate field along the channel, and the body effect caused by variations of the substrate field along the channel.

Among the techniques that have been proposed to cancel the odd-order nonlinear terms of the channel current due to the body effect is that described and claimed in U.S. Pat. No. 4,710,726 to Z. Czarnul, and also described in an article entitled "Modification of Banu-Tsividis Continuous-Time Integrator Structure" by Z. Czarnul, IEEE-Transactions on Circuits and Systems, Vol. CAS-33, No. 7, PP. 714–716, Jul. 1986. The Czarnul circuit is a MOS resistive network which employs four matched MOS transistors, each operating in its nonsaturation region. While this circuit cancels non-linearities caused by the body effect, it does not cancel nonlinearities caused by mobility variation.

An object of the present invention is to provide a highly-linear field-effect transistor voltage-controlled resistance element which overcomes the shortcomings of known techniques for linearizing the channel resistance field-effect transistor device.

SUMMARY OF THE INVENTION

The channel resistance of a field-effect transistor, preferably a MOSFET, is made highly linear with respect to the voltage across source and drain electrodes $V_S$—$V_D$ by maintaining a first voltage offset between each of the source and drain electrodes and respective ends of the gate electrode adjacent the source and drain regions, and by maintaining a second offset voltage between each of the source and drain electrodes and respective portions of the semiconductor body region adjacent to the source and drain regions. This arrangement causes the voltage drop $V_S$—$V_D$ to appear across the length of the gate electrode, across the length of the channel, and across the length of the body underlying the channel, with resulting linear voltage drops along the length of each of the three. In this manner, the channel-to-gate and body-to-channel potentials are made constant along the entire length of the channel, and variations in carrier mobility or body effect that would otherwise adversely affect the linearity of the channel resistance are avoided. The first and second offset voltages may be altered within respective ranges to tune the channel resistance. The offset voltages are preferably applied by means of respective buffer and level shifting circuits connected between the source and drain electrodes and respective ends of the gate electrodes adjacent to the source and drain regions, and between the source and drain electrodes and respective portions of the body region adjacent to the source and drain regions.

BRIEF DESCRIPTION OF THE DRAWINGS

The invention will be described with reference to the accompanying drawings in which:

FIG. 6 schematically illustrates an alternative arrangement for achieving a linear channel resistance in a MOSFET according to the invention;

FIGS. 7A, 7B, 7C and 7D are circuit diagrams showing four different techniques for providing buffering and level shifting in the device arrangements of FIGS. 2, 3 and 6.

DESCRIPTION OF THE PREFERRED EMBODIMENT OF THE INVENTION

Figure 1A:
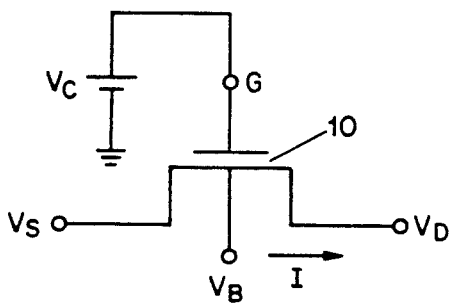
FIGS. 1A and 1B, to which reference has already been made, schematically illustrate known circuit techniques for utilizing a field-effect transistor as a voltage-controlled resistance element.
Figure 1B:
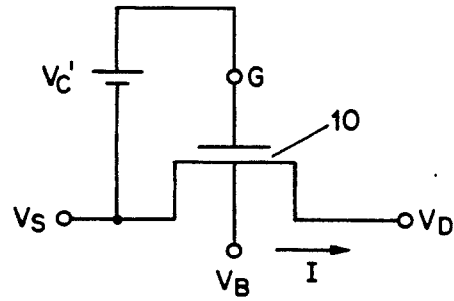

With reference to the drawings, FIGS. 1A and 1B each schematically illustrates a MOS transistor 10 having a pair of current electrodes, termed the source and drain electrodes, to which circuit voltages $V_S$ and $V_D$ are respectively applied, and a gate electrode G, which is used to control the conductance of the channel of the transistor. As is known, in the usual form of MOS transistors, the roles of the source and drain electrodes are interchangeable, and the designation of the source and drain electrodes depends on the direction of current flow from one to the other. In FIG. 1A, a control voltage $V_c$ is connected between the gate electrode G and a reference voltage, which in this case is ground, and in FIG. 1B the control voltage $V'_c$ is connected between the gate and the source electrodes.

In the arrangement of FIG. 1A, a variation in the source voltage $V_S$ results in changes in both the gate-to-source voltage $V_{GS}$ and the body-to-source voltage $V_{BS}$, which in turn causes a variation in the number of carriers and the carrier mobility (through a variation in the gate-to-channel potential), and the body effect in the channel near the source. In the arrangements of FIGS. 1A and 1B, a variation in the drain voltage $V_D$ results in changes in both the gate-to-drain voltage $V_{GD}$ and the body-to-drain voltage $V_{BD}$, which in turn causes a variation in the number of carriers and the carrier mobility (through a variation in the gate-to-channel potential), and the body effect in the channel near the drain. As explained above, variations in the number of carriers, the carrier mobility and the body effect in the channel results in nonlinearities in the channel current. The present invention avoids such channel current nonlinearities by maintaining both the gate-to-channel potential and the body-to-channel potential constant along the length of the channel, so that variations in $V_S$ or $V_D$ do not cause variations in the number of carriers, the carrier mobility or the body effect in the channel.

Figure 2:
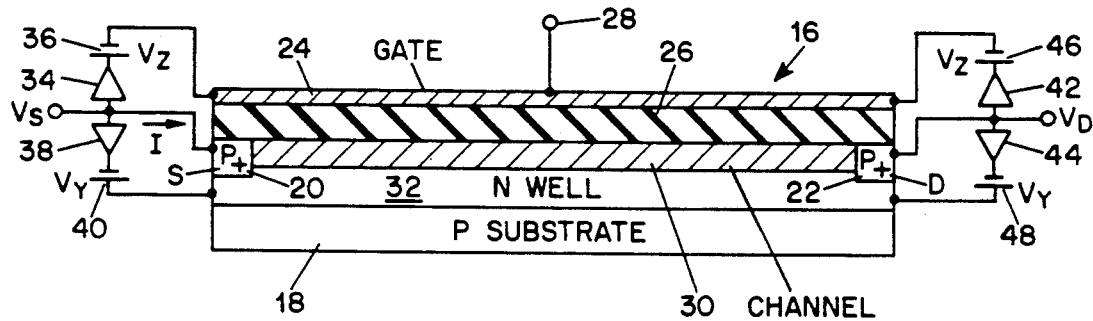
FIG. 2 is a cross-sectional view of an idealized P-channel MOS field-effect transistor and a schematic illustration of an arrangement for achieving a linear channel resistance in the transistor according to the invention.

FIG. 2 illustrates in cross section of an idealized P-channel MOSFET wherein an N-type well 32 is formed at one surface of a P-type substrate 18 made of silicon or other suitable semiconductor material. Two relatively-highly-doped, spaced-apart $P_+$-type regions 20 and 22 are formed in the surface of the N-type well 32 and serve as the source and drain regions, respectively, of the MOSFET. Ohmic contracts S and D are formed on the source region 20 and the drain region 22, respectively, and form parts of the source and drain electrodes, to which $V_S$ and $V_D$ are respectively applied. A gate electrode 24 made of an appropriate conductive material, such as polysilicon or metal, is formed over a thin layer of insulating material 26, such as silicon dioxide. This insulating layer 26 overlies the surface of the N-type well 32 between the source region 20 and the drain region 22. When a negative bias of sufficient magnitude is applied to the gate electrode 24, the resulting electric field inverts the surface beneath the gate electrode creating a P-type channel 30 which extends between the P-type source and drain regions 20 and 22. The creation of the channel 30 allows a current to flow between the source and drain electrodes S and D, as indicated by the arrow labelled "I".

In accordance with the invention, the source electrode S is coupled to the end of the gate electrode 24 adjacent the source region 20 through a unity gain buffer 34 of known design and a level shifter 36, represented in the example as a battery, for providing a negative offset voltage $-V_Z$ between the end of the gate electrode 24 adjacent the source region 20 and the source region. The source electrode is also coupled to the portion of the N-type well 32 adjacent the source region 20 through a second unity gain buffer 38 of known design and a level shifter 40, represented in the example as a battery, for providing a positive voltage offset $V_y$ between the portion of the N-type well 32 adjacent the source region 20 and the source region. Similarly, the drain electrode D is connected to the end of the gate electrode 24 and the portion of the N-type well 32 adjacent the drain region 22 through respective unity gain buffers 42 and 44, and associated level shifters 46 and 48, represented by batteries, for providing a negative offset voltage $-V_z$ between the end of the gate electrode 24 adjacent the drain region 22 and the drain region, and a positive voltage offset $V_y$ between the portion of the N-type well adjacent the drain region 22 and the drain region. This arrangement causes the source-to-drain voltage drop $V_S - V_D$ to appear not only across the channel 30, but also across the length of the gate electrode 24 and across the portion of the N-type well 32 beneath the channel. Because the voltage drops along the channel, the gate electrode and N-type well are each substantially linear along their respective lengths, the channel-to-gate and body-to-channel potentials are maintained constant along the entire length of the channel. In this manner, variations in the number of carriers, carrier mobility variations and the body effect in the channel is substantially avoided, and a linear channel resistance in $V_S$ and $V_D$ is achieved.

Figure 3:
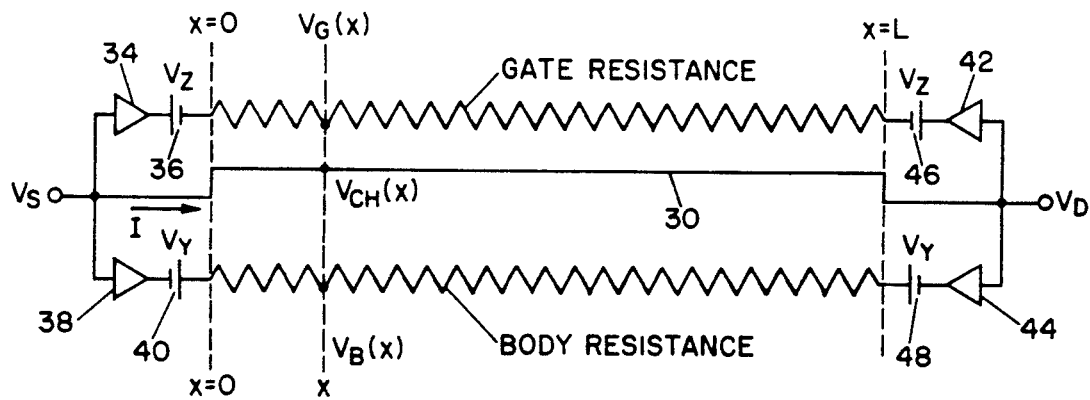
FIG. 3 is a schematic representation of the device arrangement shown in FIG. 2.

This can be demonstrated with the aid of the schematic diagram of FIG. 3 which represents a circuit model of the arrangement of FIG. 2 and wherein like parts are designated by the same reference numerals. Referring to FIG. 3, the gate and body resistances of the MOSFET are each represented by a respective one-dimensional distributed resistance of constant resistivity. These distributed resistances have equal lengths, L, corresponding to the length of channel 30. The leftmost end of each of these resistances is designated $x=0$, and the rightmost end is designated $x=L$. The gate voltage $V_G$, the channel voltage $V_{CH}$ and body voltage $V_B$ at any selected point x along the length of the channel may each be expressed as a function of x, as follows:

$$V_G(x) = V_s - V_z + \frac{x}{L}(V_D - V_S), \quad (1)$$

$$V_B(x) = V_S + V_Y + \frac{x}{L}(V_D - V_S) \quad (2)$$

and

-continued $$V_{CH}(x) = V_S + \frac{x}{L}(V_D - V_S), \quad (3)$$

where equation (3) assumes that the voltage $V_{CH}(X) - V_S$ varies linearly along the length of the channel. Subtracting equation (3) from each of equation (1) and equation (2) gives:

$$V_G(X) - V_{CH}(X) = -V_Z \text{ and} \quad (4)$$

$$V_B(X) - V_{CH}(X) = V_Y, \quad (5)$$

which demonstrates that $V_G - V_{CH}$ and $V_B - V_{CH}$ are constant throughout the length of the channel. The resistance of the channel 30 may be tuned by varying the offset voltages $V_Z$ and/or $V_Y$.

The device of FIG. 2 is preferably fabricated in planar technology. Because in a planar technology the contacts to the gate, channel and body cannot be positioned in the manner shown in FIG. 2, these contacts are advantageously formed on the upper surface of the device. In the physical layout shown in FIG. 4, the spaced source and drain regions 20 and 22 are formed in the upper surface of the N-type well 32. The opposite ends of gate electrode 24 partially overlap, but are not in electrical contact with, the source and drain regions 20 and 22. The gate electrode, which in the example is T-shaped at both ends, is separated from the N-type well 32 by a layer of insulating material 26, which overlies the surface of the well between the source and drain regions 20 and 22. Two pairs of contact windows 1 and 1', are formed at the ends of gate electrode 24 adjacent to the source and drain regions 20 and 22, respectively. Contact windows 2 and 2' are formed over the source and drain regions 20 and 22, respectively. A pair of contact windows 3 straddling the source region 20, and a pair of contact windows 3' straddling the drain region 22 are formed over the portions of N-type well 32 which are adjacent to the source and drain regions, respectively. A first pair of metal conductors 13 and 13' are connected via respective contact windows 1 to opposite ends of the "T" at the end of the gate electrode adjacent the source region 20, and a second pair of metal conductors 14 and 14' are connected via respective contact windows 1' to opposite ends of the "T" at the end of the gate electrode adjacent the drain region 22. Although not shown for the sake of simplicity, conductors 13 and 13' are electrically connected together by known techniques (e.g., crossovers or crossunders), as are conductors 14 and 14'. Two pairs of metal conductors are connected to the well 32. One pair 5 and 5' are connected to the portion of the well adjacent the source region 20 via respective contact windows 3 straddling the connection of metal conductor 11 to the source region, and a second pair 6 and 6' is connected to the portion of the well adjacent the drain region 22 via contact windows 3' straddling the connection of metal conductor 12 to the drain region 22. Conductor pairs 5 and 5' are electrically connected together by known techniques, as are conductors 6 and 6'. The alternative arrangement shown in FIG. 5 has three well contacts at each end of the channel, two straddling the source or drain region and a third located outboard from the source or drain, the three contacts at each end being electrically connected together as shown. Other contact arrangements may be used by those skilled in the art in accordance with the invention. Advantageous locations of the contacts may be determined experimentally or through known three-dimensional computer simulation of the device.

Figure 4:
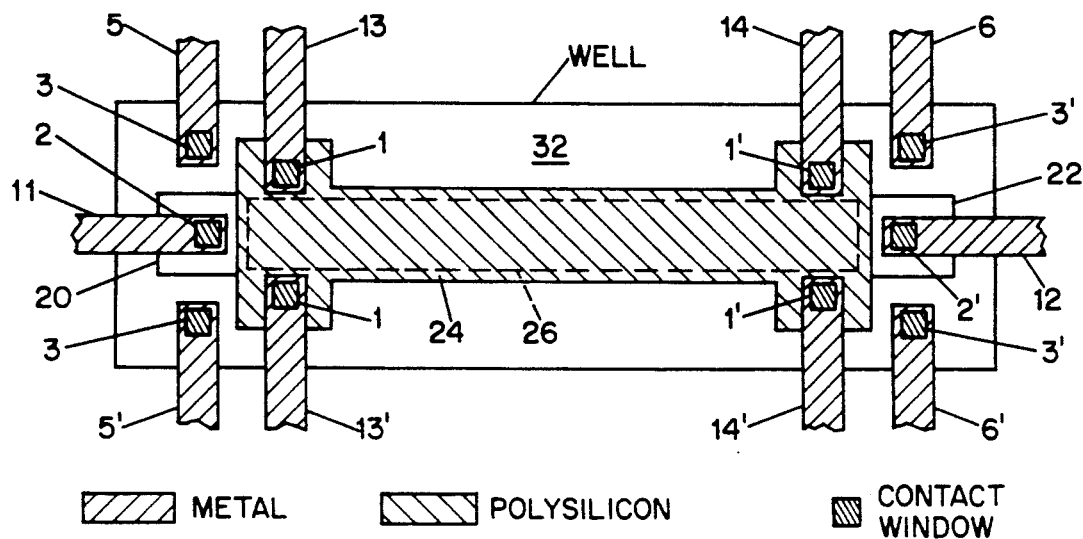
FIG. 4 is a plan view of the layout of a MOSFET device having contacts to respective portions of the body region adjacent to the source and drain region, and to respective ends of the gate adjacent the source and drain regions, according to the invention.
Figure 4A:
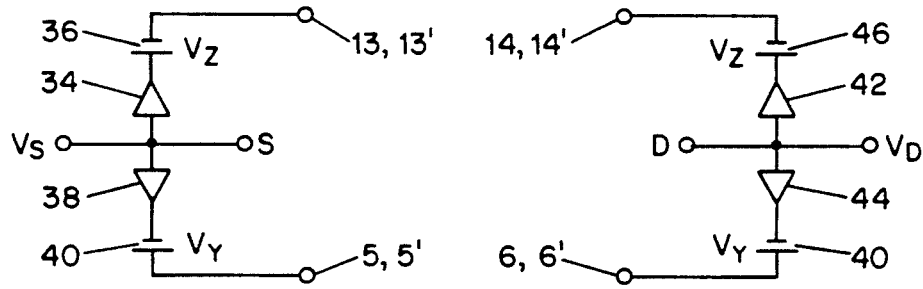
FIG. 4A is a schematic diagram showing the connection of the buffer and level shifting circuits to the structure shown in FIG. 4.
Figure 5:
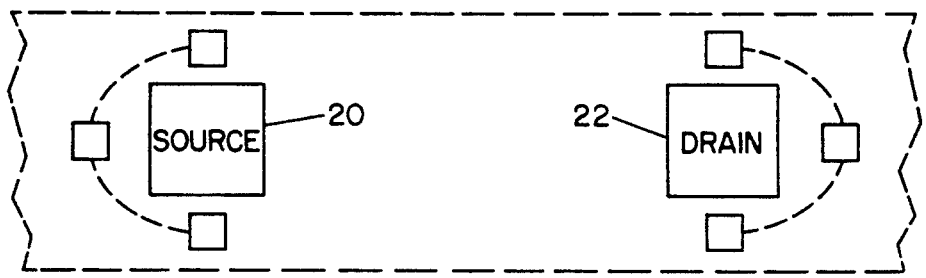
FIG. 5 is a simplified plan view of the layout of a MOSFET device showing an alternative arrangement of the contacts to respective portions of the body region adjacent the source and drain region in the device according to the invention.

The structure shown in FIG. 4 is connected to the driving circuit in the manner shown in FIG. 4A. The source electrode S of the device is connected through the buffer 34 and the level shifter 36 to the gate conductors 13 and 13'. The source electrode S is also connected through the buffer 38 and the level shifter 40 to the well conductors 5 and 5'. Similarly, the drain electrode D of the device is connected through the buffer 42 and the level shifter 46 to the gate conductors 14 and 14'. The drain electrode D is also connected through the buffer 44 and the level shifter 48 to the well conductors 6 and 6'.

Each of the pairs of buffers (34, 38 and 42, 44) coupled to opposite ends of the channel, as shown in FIG. 3, may be replaced with a single buffer, as shown in FIG. 6. That is, the source electrode S may be connected to the input of a single unity gain buffer 80, instead of the two shown in FIG. 3. The output of the buffer 80 is then coupled to the end of the gate electrode and the portion of the N-type well adjacent to the source region through level shifters 36' and 40', respectively. Similarly, the drain electrode D may be connected to the input of a single unity gain buffer 82. The output of the buffer 82 is then coupled to the end of the gate electrode and the portion of the N-type well adjacent to the drain region through level shifters 46' and 48', respectively. In special applications where it is not required to sense the channel current at one end of the channel, the buffer or buffers at that end can be omitted altogether.

The buffers and level shifters in the disclosed embodiments of the invention may be conventional circuits for providing these functions to achieve the desired channel linearity. Furthermore, it is desirable that the buffer and level shifter circuits used be capable of being integrated in the same semiconductor chip as the field-effect transistor device whose channel resistance is being linearized. Among known circuit techniques for the buffer and level shifter function for the voltage $V_Y$ is the emitter follower shown in FIG. 7A, in which the collector of an NPN bipolar transistor is, for example, connected to a voltage source $V_{EE}$, and the base is connected to the voltage $V_S$ at the source electrode S so as to produce at the emitter output, a potential $V_S + V_Y$, where $V_Y$ is the emitter-to-base voltage of the transistor in the active region of operation. A similar circuit suitable for the purpose is the Darlington pair emitter follower shown in FIG. 7B, which produces at the emitter output a potential $V_S + V_Y$, where $V_Y$ represents two emitter-to-base voltage drops.

Another known technique is the hybrid MOS-bipolar follower circuit, shown in FIG. 7C arranged to produce a voltage shift $V_Z$, in which cascaded bipolar transistor followers are driven by an MOS transistor having its gate connected to the voltage $V_S$ at the source electrode S. This circuit produces an offset voltage $V_Z$ equal to the sum of the gate-to-source voltage of the MOS stage and the base-to-emitter voltages of the bipolar transistors. A sufficient number of bipolar transistors can be used to provide the desired offset. Varying the current through the MOS stage varies the value of $V_Z$ for tuning the channel resistance of the device.

The buffer and level shifter may also be implemented using an operational amplifier of conventional design, as shown in FIG. 7D. Referring to FIG. 7D, the voltage $V_S$ at the source electrode S is applied to the noninverting input of the amplifier, and a voltage shift $V_Z$ having the indicated polarity is connected from the output to the inverting input to produce an output voltage $V_S - V_Z$. The voltage shift $V_Z$ may also be implemented as a current-dependent voltage drop across a resistor or transistor, where the current through the device may be varied to change $V_Z$ for tuning the channel resistance of the field-effect transistor resistance device.

It will be understood that the circuits of FIGS. 7A–D, which have been described as providing the offset voltage $V_Z$ between the source and drain regions and the ends of the gate electrode adjacent to the source and drain regions, respectively, are also equally applicable for providing the offset voltage $V_Y$ between the source and drain regions and respective portions of the body adjacent to the source and drain regions, with appropriate modifications known to those skilled in the art.

Figure 8:
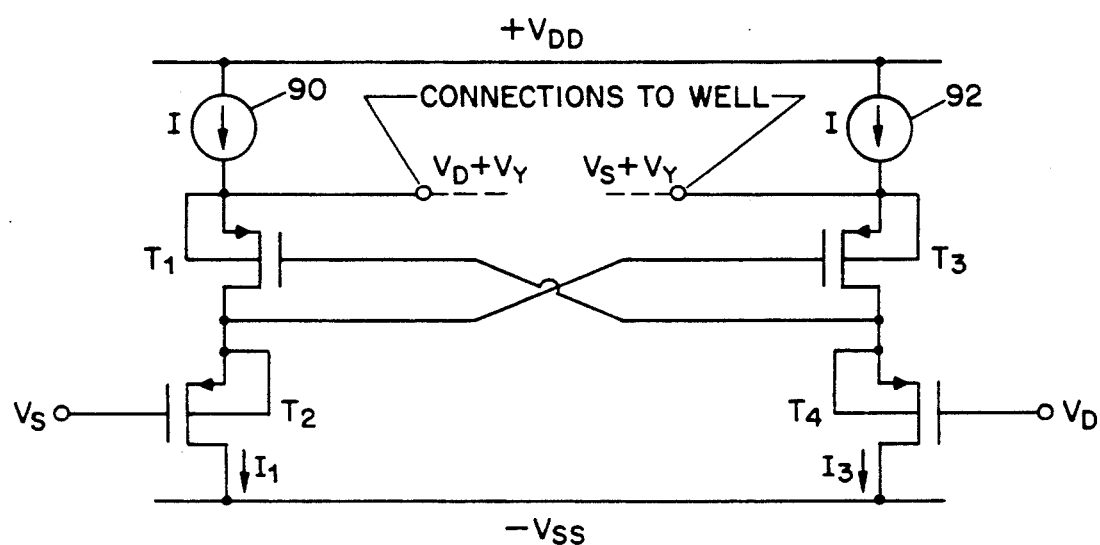
FIG. 8 is a circuit diagram showing another technique for providing buffering and level shifting in the device arrangements of FIGS. 2, 3 and 6.

Yet another known unity-gain buffer and level shifter circuit suitable for providing offset voltages between the source and drain regions, and the ends of the gate electrode and the portions of the body adjacent the source and drain regions, respectively, is the circuit shown in FIG. 8. This circuit consists of two pairs of MOS transistors, $T_1$, $T_2$ and $T_3$, $T_4$, each connected in series with a respective current source 90 and 92 between supply voltages $+V_{DD}$ and $-V_{SS}$. The gate of $T_1$ is connected to the common node of $T_3$ and $T_4$, while the gate of $T_3$ is connected to the common node of $T_1$ and $T_2$. The voltages at the source and drain electrodes, $V_S$ and $V_D$, of the field-effect transistor resistance device are applied to the gates of $T_2$ and $T_4$, respectively, and shifted voltages $V_S + V_Y$ and $V_D + V_Y$ are provided at the source terminals of $T_3$ and $T_1$, respectively. The offset voltage $V_Y$ may be expressed by the following relationship:

$$V_Y = V_{SG}(I_1) = V_{SG}(I_3), \qquad (6)$$

where $V_{SG}$ is the source-to-gate voltage of $T_2$ and $T_3$, or of $T_4$ and $T_1$, $I_1$ is the current through $T_1$ and $T_2$, and $I_3$ is the current through $T_3$ and $T_4$. That is, the shifts of $V_S$ and $V_D$ are equal as required. Other circuits using MOS or bipolar devices, or combinations of device types, will be known to those skilled in the art for providing the required buffering and level shifting functions in accordance with the invention.

While the invention has been described with reference to several exemplary embodiments thereof, it will be understood by those skilled in the art that various changes in form, detail or design may be made therein without departing from the spirit and scope of the invention. For example, the field-effect transistor of the resistance device may be of a depletion type, in which case $V_Z$ would be of the opposite polarity, or the transistor may be an N-channel device where the body region is p-type, and the source and drain regions are N-type semiconductor material. Moreover, the field-effect transistor need not be of the insulated gate type but may instead be a junction field effect transistor (JFET) where the gate electrode is a surface region of one conductivity type formed in a channel region of the opposite conductivity type, and at the ends of the channel region the source and drain regions are of the opposite conductivity type, and the body region opposing the gate electrode is of the one conductivity type. If the field-effect transistor is a JFET, $V_Z$ and $V_Y$ have the same polarity.

I claim:

1. A voltage-controlled linear resistance device comprising:
   a field-effect transistor having spaced source and drain regions formed in a semiconductor body region, a first electrode for applying a first voltage signal to the source region, a second electrode for applying a second voltage signal to the drain region, and a gate electrode overlying the body region between the source and drain regions, the gate electrode having a first end adjacent to the source region and a second end adjacent to the drain region;
   first means for applying a first offset voltage between the source region and the first end of the gate electrode, and between the drain region and the second end of the gate electrode; and
   second means for applying a second offset voltage between the source region and a portion of the body region adjacent to the source region, and between the drain region and a portion of the body region adjacent to the drain region,
   whereby the resistance between the first and second electrodes is substantially constant with respect to the voltage across the first and second electrodes.

2. A device according to claim 1, wherein the first means comprises first buffer and level shifting circuit means connected between the first electrode and at least one contact to the first end of the gate electrode, and between the second electrode and at least one contact to the second end of the gate electrode, and the second means comprises second buffer and level shifting circuit means connected between the first electrode and at least one contact to the portion of the body region adjacent to the source region, and between the second electrode and at least one contact to the portion of the body region adjacent to the drain region.

3. A device as set forth in claim 2, wherein the first and second buffer and level shifting circuit means comprise at least two unity gain amplifiers.

4. A device according to claim 2, wherein the first and second buffer and level shifting circuit means comprise a first unity gain amplifier having an input terminal connected to the first electrode and an output terminal, and first and second level shifting means respectively connected between the output terminal of the first unity gain amplifier, and each of the at least one contact to the first end of the gate electrode and each of the at least one contact to the portion of the body adjacent to the source region, for applying to the first end of the gate electrode and to the portion of the body region adjacent to the source region voltages which are respectively offset by first and second values from the voltage at the first electrode, and a second unity gain amplifier having an input terminal connected to the second electrode and an output terminal, and third and fourth level shifting respectively means connected between the output terminal of the second unity gain amplifier, and each of the at least one contact to the second end of the gate electrode and each of the at least one contact to the portion of the body adjacent to the drain region, for applying to the second end of gate electrode and to the portion of the body region adjacent to the drain region voltages which are respectively offset by the first and second values from the voltage at the second electrode.

5. A device as set forth in claim 2, wherein the first buffer and level shifting circuit means comprises first and second unity gain amplifiers each having an input terminal connected to the first and second electrodes, respectively, and each having an output terminal, and first and second level shifting means respectively connected between the output terminals of the first and second unity gain amplifiers, and each of the at least one contact to the first end and each of the at least one contact to the second end of the gate electrode, for applying to the first and second ends of the gate electrodes voltages which are offset by a first value from the voltages at the first and second electrodes, respectively, and the second buffer and level shifting circuit means comprises third and fourth unity gain amplifiers each having an input terminal connected to the first and second electrodes, respectively, and each having an output terminal, and third and fourth level shifting means respectively connected between the output terminals of the third and fourth unity gain amplifiers, and each of the at least one contact to the portion of the body region adjacent to the source region and each of the at least one contact to the portion of the body region adjacent to the drain region, for applying to the portions of the body region adjacent to the source and drain regions voltages which are offset by a second value from the voltages at the first and second electrodes, respectively.

6. A device as set forth in claim 1, wherein at least one of the first and second means includes means for varying at least one of the first and second offset voltages for tuning the resistance between the first and the second electrodes.

7. A device as set forth in claim 4, wherein at least one of the first, second, third and fourth level shifting means includes means for varying at least one of the first and second values of the offset voltages provided by the first and second level shifting means, and by the third and fourth level shifting means, for tuning the resistance between the first and second electrodes.

8. A device as set forth in claim 5, wherein at least one of the first, second, third and fourth level shifting means includes means for varying at least one of the first and second values of the offset voltages provided by the first and second level shifting means, and by the third and fourth level shifting means, for tuning the resistance between the first and second electrodes.

9. A device as set forth in claim 1, wherein said transistor is a metal-oxide-semiconductor field-effect transistor.

* * * * *